United States Patent [19]

Okuyama et al.

[11] Patent Number: 4,904,615
[45] Date of Patent: * Feb. 27, 1990

[54] METHOD OF MAKING A READ ONLY MEMORY DEVICE

[75] Inventors: Kousuke Okuyama, Kowagoe; Ken Uchida, Higashiyamoto; Kouichi Kusuyama, Mitaka; Satoshi Meguro; Hisao Katto, both of Hinode; Kazuhiro Komori, Kodaiara, all of Japan

[73] Assignees: Hitachi, Ltd.; Hitachi Microcomputer Engineering Ltd., both of Tokyo, Japan

[*] Notice: The portion of the term of this patent subsequent to Apr. 4, 2006 has been disclaimed.

[21] Appl. No.: 301,978

[22] Filed: Jan. 26, 1989

Related U.S. Application Data

[63] Continuation of Ser. No. 111,690, Oct. 22, 1987, Pat. No. 4,818,716.

[30] Foreign Application Priority Data

Oct. 22, 1986 [JP] Japan .................. 61-249725

[51] Int. Cl.⁴ .......................... H01L 21/265
[52] U.S. Cl. .......................... 437/52; 437/27; 437/28; 437/41; 437/45; 437/48; 437/51; 437/193; 437/49
[58] Field of Search .......... 437/43, 45, 27, 28, 437/48, 49, 50, 52; 357/23.5; 365/104, 174, 168

[56] References Cited

U.S. PATENT DOCUMENTS

| | | | |
|---|---|---|---|
| Re. 29,660 | 6/1978 | Armstrong | 437/45 |
| 3,653,978 | 4/1979 | Robinson et al. | 437/45 |
| 3,876,472 | 4/1975 | Polinsky | 437/45 |
| 4,035,906 | 7/1977 | Tasch et al. | 437/43 |
| 4,193,183 | 3/1980 | Klein | 437/45 |
| 4,295,209 | 10/1981 | Dowley | 365/168 |
| 4,328,563 | 5/1982 | Schroeder | 365/104 |
| 4,342,100 | 7/1982 | Kuo | 365/104 |
| 4,356,042 | 10/1982 | Gedaly et al. | 437/45 |
| 4,358,889 | 11/1982 | Dickman et al. | 437/438 |
| 4,364,167 | 12/1982 | Dowley et al. | 437/45 |
| 4,500,975 | 2/1985 | Shirato | 365/104 |

FOREIGN PATENT DOCUMENTS

0033873 2/1984 Japan .................. 437/43

Primary Examiner—Brian E. Hearn
Assistant Examiner—T. Thomas
Attorney, Agent, or Firm—Antonelli, Terry & Wands

[57] ABSTRACT

Disclosed are memory cells of a vertical-type read only memory (ROM) having a plurality of MISFETs connected in series. The MISFETs include gate electrodes formed with multiple conductive layers, in which some of the MISFETs are set to the depletion type and at least some of the remaining MISFETs are set to the enhancement type, so as to write information in the memory cells. The information write operation is conducted through at least two steps. Namely, in the first information write step, gate electrodes are used as a mask to implant an impurity; and in the second step, an impurity is implanted through the gate electrodes into the surface of the semiconductor substrate. These steps enable a semiconductor memory device, such as a vertical-type mask ROM having memory cells with a reduced series resistance and being suitable for a high degree of integration, to be produced.

Furthermore, there is disclosed a memory structure of a semiconductor memory device suitable for a higher degree of integration through an arrangement of gate electrodes of multiple layers.

13 Claims, 10 Drawing Sheets

METHOD OF MAKING A READ ONLY MEMORY DEVICE

This application is a continuing application of application Ser. No. 07/111,690, filed Oct. 22, 1987, now U.S. Pat. No. 4818716.

BACKGROUND OF THE INVENTION

The present invention relates to a semiconductor integrated circuit device, and in particular, to a technology effectively applicable to a semiconductor storage device having a vertical-type mask read only memory (ROM).

The semiconductor storage device having a mask ROM is advantageous in that the device is of a low cost and is satisfactorily safe against the destruction of information therein. The mask ROMs include a horizontal-type (parallel-type) mask ROM and a vertical-type mask ROM. The vertical-type mask ROM, as compared with the horizontal-type mask ROM, has a feature that a high integration is facilitated and hence a great amount of information can be accommodated.

In Japanese patent application Laid-Open No. 53-41188, filed by the present assignee, there is described a vertical-type mask ROM suitable for high integration. According to the vertical-type mask ROM, a plurality of gate electrodes of a first layer are disposed at a predetermined interval in the direction of the length of the gate, and gate electrodes of a second layer are formed between the gate electrodes of the first layer. The first-layer gate electrodes are formed from a polycrystalline silicon film of the first layer to establish memory cells each formed with an MIS capacitor or an MISFET. The second-layer gate electrodes are formed from a polycrystalline silicon film of the second layer, with the respective end portions of the second-layer gate electrodes overlying those of the first-layer gate electrodes, thereby establishing memory cells each formed with an MIS capacitor or an MISFET. The memory cells can be considered to be formed with an MIS capacitor established between the gate electrodes and a substrate or with an MISFET in which the channel regions of the memory cells on both sides of the MIS capacitor are regarded as a source and a drain for an electric current. Each memory cell is therefore connected in series. In a space between the first-layer gate electrodes and the second-layer gate electrodes (i.e., between memory cells), there need not be disposed a semiconductor region for the source and drain regions. Consequently, the memory cell areas can be considerably reduced.

SUMMARY OF THE INVENTION

The present inventors have found, as a result of an investigation on an operation to write information in the memory cells of the vertical-type mask ROM, that the following problems arise.

Information is written in the memory cells including the first-layer gate electrodes as follows. First, the first-layer gate electrodes are formed on a substrate. Thereafter, into the primary surface of the substrate between the memory cells in which information is to be written, namely, between the first-layer gate electrodes, an impurity substance for writing first information is implanted by use of the first-layer gate electrodes as a mask. The impurity substance for writing first information sets, in a threshold voltage control region (channel region) beneath the regions where the second-layer gate electrodes are to be formed, the threshold voltage from the depletion type to the enhancement type, or vice versa. Since the gate electrodes of the first layer are used as the mask for implanting the impurity substance, the operation to write the first information can be effected in a self-alignment fashion with respect to the first-layer gate electrodes.

On the other hand, the operation to write information in the memory cells formed by the gate electrodes of the second layer is achieved as follows. First, an impurity substance for writing second information is implanted into the primary surface of the substrate beneath the regions where the first-layer gate electrodes are to be formed. The impurity substance for writing second information sets the threshold voltage of the memory cells from the depletion type to the enhancement type, or vice versa. Thereafter, on the substrate where the impurity for writing second information is implanted, the first-layer gate electrodes are formed. Consequently, between the region in which the impurity for writing second information is implanted and the first-layer gate electrodes, there need be a margin for matching the mask in the manufacturing process. Since the margin for matching the mask increases the size of the gate length for the first-layer gates and the memory cell area, there arises a problem that the degree of integration of the vertical-type mask ROM is lowered.

Furthermore, the present inventors have found, as a result of discussion on the high integration of the vertical-type mask ROM, that the following problem also arises.

Each second-layer gate electrode has a separation dimension on the first-layer gate electrodes. Consequently, in consideration of the separation dimension, the size of the gate length must be, in the design, increased by the separation dimension.

It is therefore an object of the present invention to provide a technology capable of increasing the degree of integration of a semiconductor storage device having the vertical-type mask ROM.

Another object of the present invention is to provide a technology capable of achieving the first object in which the operation to write information in the memory cells is effected in a self-aligning fashion with respect to the gate electrodes.

Still another object of the present invention is to provide a technology capable of achieving the first object in which the size of the gate length is minimized for the gate electrodes of the memory cells.

Still another object of the present invention is to provide a technology capable of achieving reduction of the size of the gate length for the gate electrodes of the first layer.

Another object of the present invention is to provide a technology capable of increasing the operation speed of a semiconductor storage device having the vertical-type mask ROM.

Still another object of the present invention is to provide a technology capable of reducing the time required to complete the manufacturing process of a semiconductor device having the vertical mask ROM (to be referred to as a process completion time reduction).

The above and other objects and novel features of the present invention will become apparent from the following detailed description taken in conjunction with the accompanying drawings.

Among the features of the present invention, the representative features will be described. Such representative features are illustrative and not limiting.

After forming the first-layer gate electrodes of the semiconductor storage device having a vertical-type mask ROM, an impurity substance is implanted, through the first-layer gate electrodes, into the primary surface of the substrate beneath the first-layer electrodes, thereby writing information therein.

Furthermore, gate electrodes of second and third layers are respectively formed in an alternating fashion between the first-layer gate electrodes.

According to the means described above, since the write operation of information in the memory cells established by the first-layer gate electrodes (control of the threshold voltage) can be effected in self-alignment with respect to the first-layer gate electrodes, the areas of the memory cells can be reduced. That is, the degree of integration of the vertical-type mask ROM can be increased.

Moreover, since second-layer gate electrodes and third-layer gate electrodes are overlapped with each other so as to dispense with the separation dimension therebetween on the first-layer gate electrodes, the size of the gate length of the first-layer gate electrodes can be reduced, to reduce the areas of the memory cells formed including the first-layer gate electrodes. Namely, the degree of integration of the vertical-type mask ROM can be improved.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1:
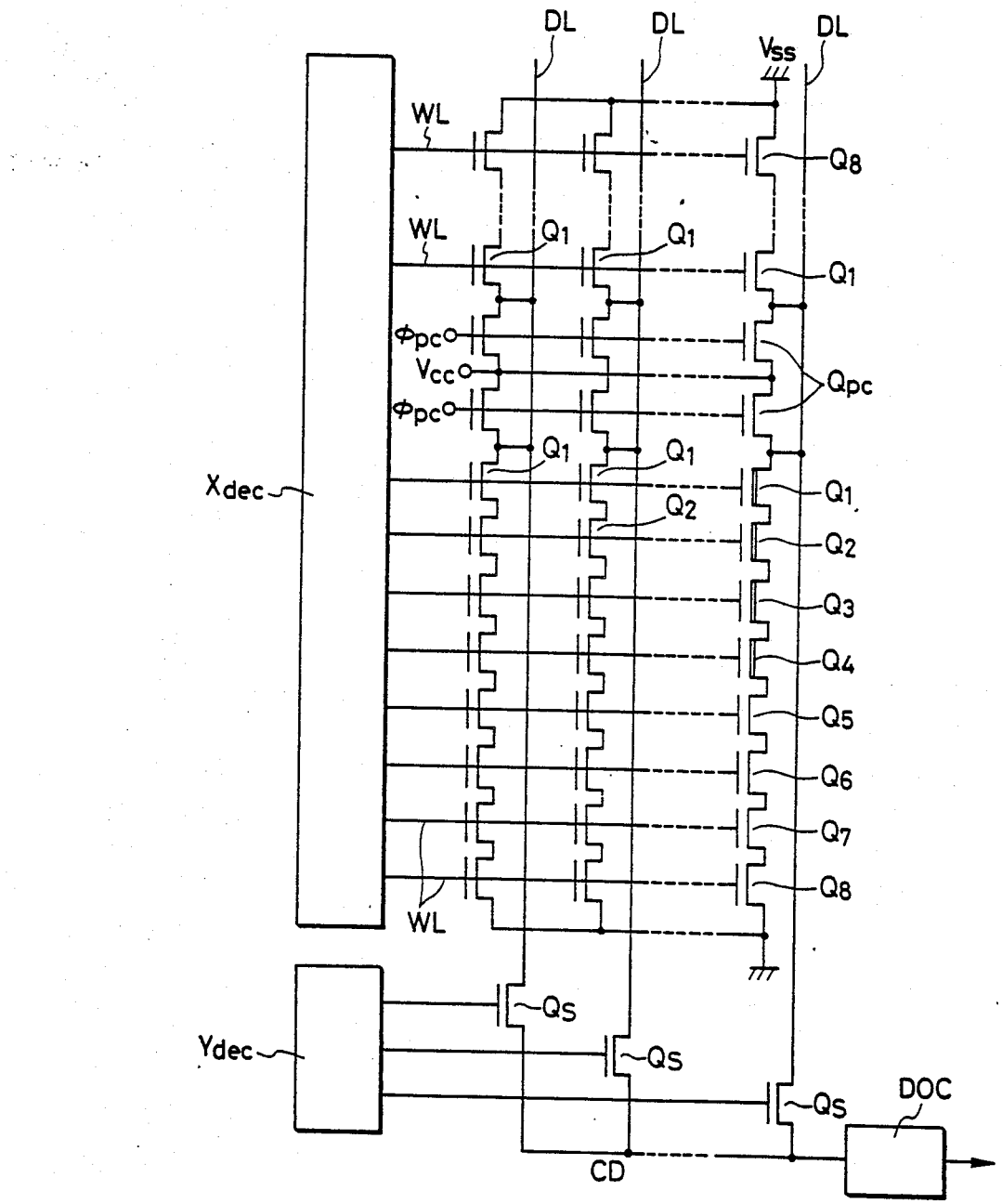
FIG. 1 is an equivalent circuit diagram showing a vertical-type mask ROM as Embodiment I of the present invention.

A description will be given of the configuration of the present invention with reference to embodiments.

In the drawings of the embodiments, components having the same functions will be assigned the same reference numerals, and repetitious description thereof will be omitted.

Embodiment I

FIG. 1 shows an equivalent circuit diagram of a vertical-type mask ROM as Embodiment I of the present invention.

As shown in FIG. 1, in the memory cell array of the vertical-type mask ROM, there are disposed memory cells $Q_1$–$Q_8$ comprising an MIS capacitor, or MIS diode, or an MISFET (to be simply referred to as an MISFET herebelow). The memory cells $Q_1$–$Q_8$ are connected in series. Eight (or 16, 32 . . . ) memory cells $Q_1$–$Q_8$ constitute a unit memory cell row including eight (or 16, 32 . . . ) bits.

The memory cell Q includes an MISFET of the depletion type (first threshold voltage) for "0" information or of the enhancement type (second threshold voltage) for "1" information. Each of the gate electrodes of the memory cells $Q_1$–$Q_8$ is connected to a respective word line WL elongated in the column direction. The word line WL is so configured to control conduction and nonconduction of the memory cell Q. Each word line WL has an end connected to an X decoder circuit Xdec.

A memory cell $Q_1$ of the unit memory cell row, more concretely, the drain of the MISFET constituting the memory cell $Q_1$ is connected to a data line DL disposed in the row direction and the power source voltage Vcc via a precharge MISFET Qpc of which a gate electrode is supplied with a precharge signal $\phi pc$. The power source voltage is, for example, the operation voltage 5 [V] of the circuit. The data line DL has an end connected to a common data line CD via an MISFET Qs constituting the column switch. The gate electrode of the MISFET Qs is connected to the Y decoder circuit Ydec. The memory cell $Q_8$ of the unit memory cell row, more concretely, the source of the MISFET constituting the memory cell $Q_8$, is connected to the reference voltage Vss, which is, for example, the ground potential 0 [V] of the circuit. As will be described later, the power source voltage Vcc and the reference voltage Vss each are disposed to be shared among a plurality of unit memory cells arranged in the column direction so as to configure the power source voltage wiring and the reference voltage wiring, respectively.

The unit memory cell row includes a pair of symmetric items along the row direction centered on the precharging MISFET Qpc. A plurality of the paired unit memory cell rows are arranged in the iterating pattern in the row direction and in the column direction to constitute a memory cell array.

For a memory cell comprising an enhancement-type MISFET, for example, each of the memory cells $Q_1$–$Q_4$, an impurity substance is implanted into a depletion-type MISFET to set the threshold voltage to the enhancement type. As the impurity substance, a p-type impurity material such as boron (B), boron fluoride ($BF_2$), or the like, can be used.

Next, a description will be given of a concrete configuration of the Embodiment I.

Figure 2:
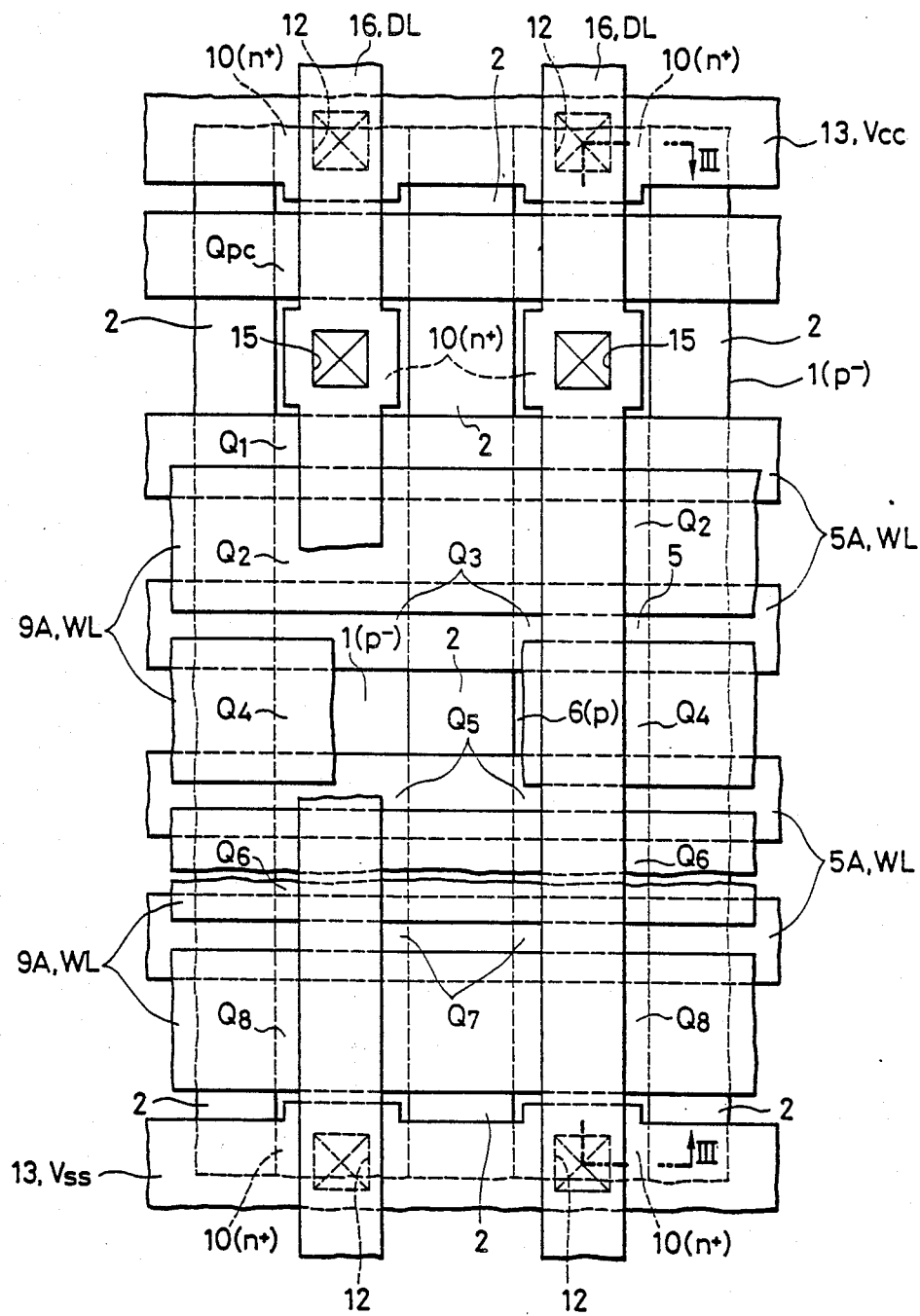
FIG. 2 is a plan view of a substantial part of a memory cell array constituting the vertical-type mask ROM.
Figure 3:
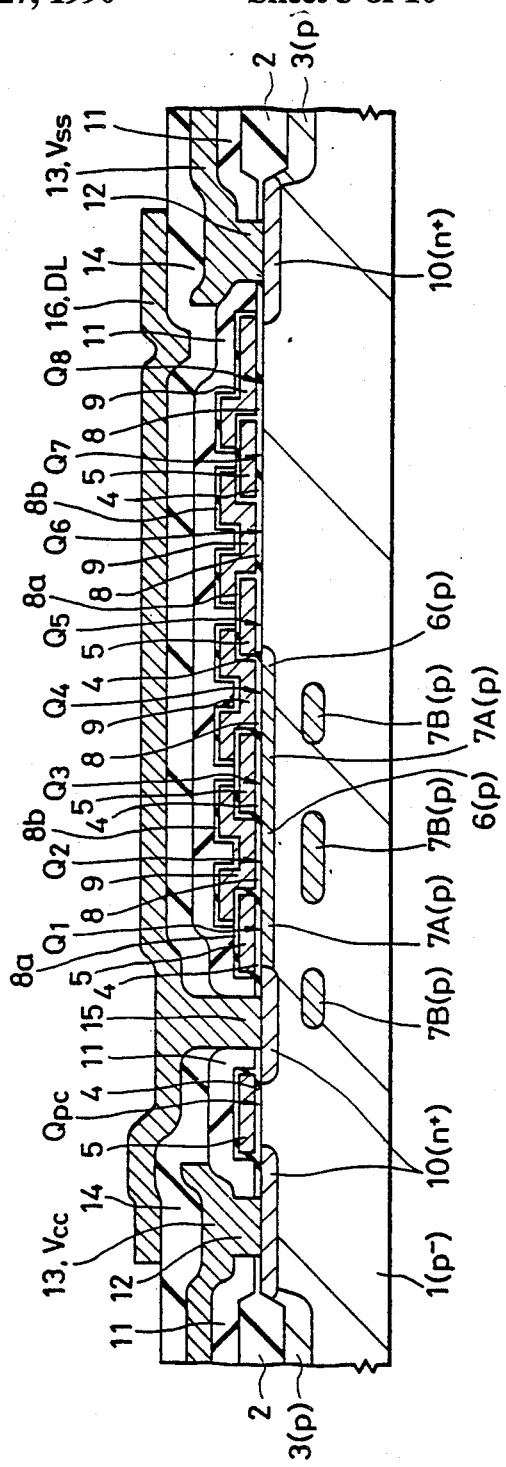
FIG. 3 is a cross-sectional view of the memory cell array of FIG. 2 along line III—III.

FIG. 2 shows a plan view of a primary part of the memory cell array of the vertical-type mask ROM according to Embodiment I of the present invention, whereas FIG. 3 is a cross-sectional view of the memory cell array along line III—III of FIG. 2. In FIG. 2, for an easy understanding of the configuration of the present embodiment, only the field insulation layers disposed between the respective conductor layers are included; furthermore, a part of the data line and the gate electrodes of the second layer are omitted.

In FIGS. 2-3, reference numeral 1 indicates a p⁻type semiconductor substrate (or a well region) formed of monocrystalline silicon. On the primary surface of the semiconductor substrate 1, there are respectively disposed a field insulation layer 2 and a p type channel stopper region 3. The field insulation layer 2 and the channel stopper region 3 are so constituted to electrically separate semiconductor devices. The field insulation layer 2 is configured to restrict the shape of the unit memory cell row (concretely, the dimension of the gate width or channel width of the MISFET in the unit memory cell row).

The memory cells $Q_1$–$Q_8$ are respectively formed on the primary surface of the semiconductor substrate 1.

The memory cells $Q_1$, $Q_3$, $Q_5$ and $Q_7$ include MISFETs comprising the semiconductor substrate 1, the gate insulation layer 4, and the first-layer gate electrode 5. The memory cells $Q_2$, $Q_4$, $Q_6$ and $Q_8$ include MISFETs comprising the semiconductor substrate 1, the gate insulation layer 8, and the second-layer gate electrode 9.

The gate insulation layer 4 and 8 each are manufactured of, for example, silicon oxide.

The gate electrodes 5 of the first layer are made from a conductor layer (of a gate material) of the first layer in the manufacturing process, for example, from a polycrystalline silicon layer. The gate electrodes 9 of the second layer are made from a conductor layer (of a gate material) of the second layer in the manufacturing process, for example, from a polycrystalline silicon layer. The first-layer gate electrodes 5, of the respective memory cells $Q_1$, $Q_3$, $Q_5$ and $Q_7$, are arranged at a predetermined interval therebetween in the direction of the gate length (i.e., the channel length). The second-layer gate electrodes 9, of the respective memory cells $Q_2$, $Q_4$, $Q_6$ and $Q_8$, are so arranged between the first-layer gate electrodes 5 that the respective end portions overlap on the gate electrodes 5.

The first gate electrodes 5 of the respective memory cells $Q_1$, $Q_3$, $Q_5$ and $Q_7$ are disposed with word lines (WLs) 5A configured to be integral therewith. The second-layer gate electrodes 9 of the respective memory cells $Q_2$, $Q_4$, $Q_6$ and $Q_8$ are disposed with word lines (WLs) 9A configured to be integral therewith.

In addition, each of the gate electrodes 5 and 9 may be manufactured from films of a refractory meal (Mo, Ti, Ta, W) or a refractory metal silicide ($MoSi_2$, $TiSi_2$, $TaSi_2$, $WSi_2$). Moreover, each of the gate electrodes 5 and 9 may be made from a composite layer in which the refractory metal film or a refractory metal silicide film is laminated on a polycrystalline silicon layer.

Each of the memory cells $Q_1$–$Q_8$ is so configured as to form a depletion-type MISFET, namely, to have a low threshold voltage when information is not written therein. That is, although not shown in the drawings, the principal surface of the memory cell region of the p⁻type semiconductor substrate 1 is converted into an n type region by implanting an n type impurity substance, for example, phosphorus, therein. A p type semiconductor region 7A is disposed in the threshold voltage control region (channel region) of each of the memory cells $Q_1$ and $Q_3$ in which information has been written. Similarly, a p type semiconductor region 6 is disposed in the threshold voltage control region of each of the memory cells $Q_2$ and $Q_4$ in which information has been written. The semiconductor regions 7A and 6 each are so configured that the depletion-type MISFET having a low threshold value is to be changed to an enhancement-type MISFET having a high threshold value.

As will be described later, the semiconductor region 7A is formed in self-alignment with respect to the first-layer gate electrodes 5, and the semiconductor region 6 is also formed in self-alignment with respect to the first-layer gate electrodes 5. In a deep region of the semiconductor substrate 1 beneath the semiconductor region 6, there is formed a p type semiconductor region 7B. The deep region is the region other than the threshold voltage control regions in each of the memory cells $Q_2$ and $Q_4$. The semiconductor region 7B can be formed in the same processing step as the semiconductor region 7A, in regions not to change the respective threshold voltages of the memory cells $Q_2$ and $Q_4$.

To an end side (the side of the memory cell $Q_1$) of the unit memory cell row as configured above, there is connected a precharge MISFET Qpc. The MISFET Qpc is formed in the principal surface of the semiconductor substrate 1 and includes a gate insulation layer 4, a gate electrode 5, and a semiconductor region of n⁺type 10 to be used as a source region or a drain region in a pair. To establish a connecting region between the MISFET Qpc and the unit memory cell row, the source region of the MISFET Qpc, namely, a semiconductor region 10, is commonly used as the drain region of the memory cell $Q_1$.

The semiconductor region 10 used as the drain region of the MISFET Qpc is connected to a wiring (power source voltage wiring) 13 to be applied with a power source voltage Vcc. The wiring 13 is elongated through a connecting hole 12 formed through an insulation layer 11 made of, for example, a phosphosilicate glass (PSG), so as to be electrically connected to the semiconductor region 10. In the manufacturing process, the wiring 13 is manufactured in the wiring process to form the first wiring layer, for example, with an aluminum film or an aluminum film with predetermined additional substances (Cu, Si).

The semiconductor region 10 commonly used as the drain region of the memory cell $Q_1$ and as the source region of the MISFET Qpc is connected to a data line (DL) 16. The data line 16 is elongated through a connecting hole 15 disposed on an insulation layer between layers 14 made of, for example, PSG, so as to be electrically connected to the semiconductor region 10. In the manufacturing process, the data line is manufactured in the wiring process to form the second wiring layer, for example, with an aluminum film like that of the wiring 13.

To the other end (the end of the memory cell $Q_8$), there is connected a wiring (a reference voltage wiring) 13 via the semiconductor region of n⁺type 10 disposed as the source region of the memory cell $Q_8$, the wiring being supplied with a reference voltage Vss.

Next, a manufacturing method and the information write method of the vertical-type mask ROM thus configured will be briefly described with reference to FIGS. 4–7 and 13 (cross-sectional views of primary sections of the memory array cell illustrated for each manufacturing processing step).

Figure 4:
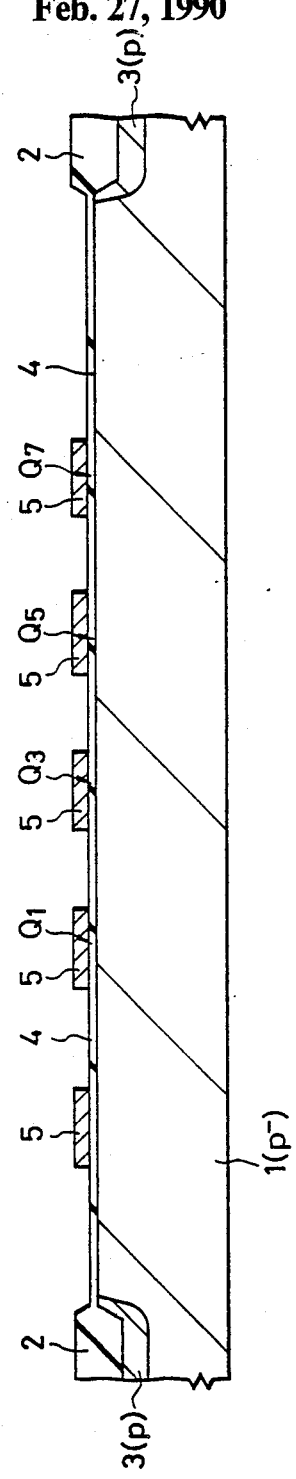
FIGS. 4-7 are cross-sectional views showing a main part in manufacturing processing steps of the memory cell array of FIG. 3.

First, as shown in FIG. 4, a p type channel stopper region 3 and a field insulation layer 2 are respectively formed on the principal surface of the semiconductor substrate of p⁻-type 1.

Figure 13:
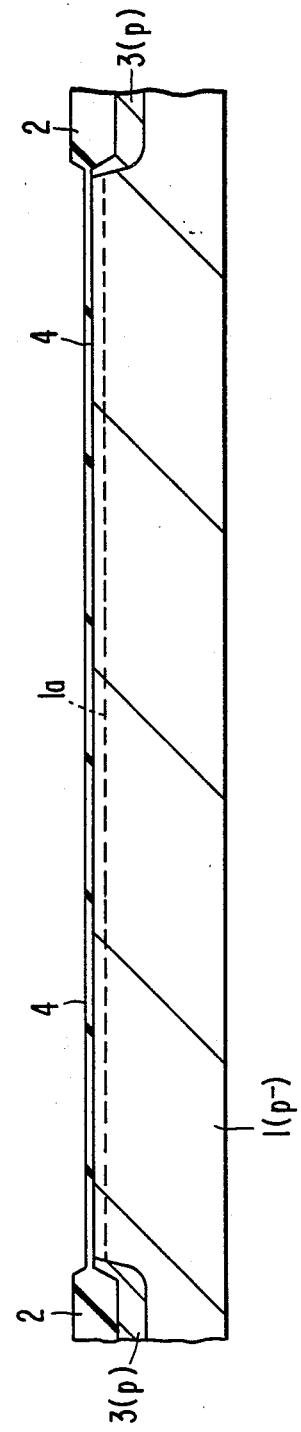
FIG. 13 is a cross-sectional view showing a main part in a manufacturing processing step of the memory cell array of FIG. 3.

Next, a gate insulation layer 4 is formed on the semiconductor substrate 1 in the semiconductor device region where the semiconductor device is to be formed. The gate insulation layer 4 is, for example, a silicon oxide film formed by thermally oxidizing the surface of the semiconductor substrate 1, with the thickness of the oxide layer set to about 100–300 Å. As shown in FIG. 13, thereafter, in the principal surface of the semiconductor substrate 1 where the memory cell is to be formed, namely, in the threshold voltage control region (channel region) of the MISFET of the memory cell, an impurity substance is implanted (see reference character $1a$) to adjust the threshold voltage. The impurity substance to adjust the threshold value is implanted to form the memory cell Q with a depletion-type MISFET, namely, an MISFET having a low threshold voltage. In this case, an n type impurity (As, P) is implanted by use of ion implantation technology.

Next, a polycrystalline silicon layer film is formed on the principal surface of the semiconductor substrate 1 according to, for example, the chemical vapor deposition (CVD) method, and then a patterning process is conducted on the polycrystalline silicon layer. Thereafter, the gate electrodes of the first layer 5 are formed on the predetermined regions of the gate insulation layer (film) 4. The first-layer gate electrodes 5 may be manufactured of a polycrystalline silicon layer in which, for example, an impurity (As, P) is implanted to reduce the resistance value of the gate electrodes 5. The thickness of the polycrystalline silicon layer is set to about 3000–10000 Å. Through the process to form the first-layer gate electrodes 5, the memory cells $Q_1$, $Q_3$, $Q_5$ and $Q_7$ comprising the MISFET are established.

Figure 5:
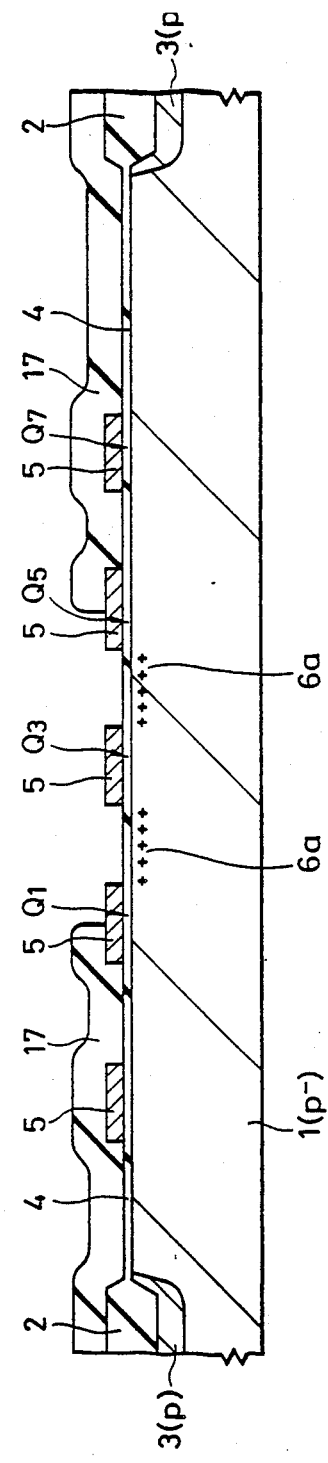

Next, a mask for impurity implantation 17 is disposed, the mask having, as shown in FIG. 5, openings at regions where the memory cells $Q_2$ and $Q_4$ are to be formed (where the second-layer gate electrodes 9 between the first-layer gate electrodes 5 are to be formed). The mask 17 is so configured, in consideration of the margin of the mask alignment in the manufacturing process, that the opening end portions are located on the first-layer gate electrodes 5. The mask 17 is formed, for example, of a photoresist film.

Next, on the surface of the semiconductor substrate 1 corresponding to the regions where the memory cells $Q_2$ and $Q_4$ are to be formed, there is implanted an impurity $6a$ for writing the first information, thereby effecting the first information writing operation. For the implantation of the impurity $6a$ for writing information, the mask 17 and the first-layer gate electrodes 5 not covered therewith are used as the mask. The impurity $6a$ is implanted in the threshold voltage control regions respectively of the memory cells $Q_2$ and $Q_4$ so as to change the depletion-type MISFETs having a high threshold voltage. As the impurity $6a$, boron fluoride (BF2) is implanted with an impurity concentration of about $1 \times 10^{13}$ to $3 \times 10^{13}$ atoms/cm². The impurity $6a$ is subjected to ion implantation with a low energy of about 60 KeV, which does not allow the ions to pass through the first-layer gate electrodes 5. The peak value of the impurity concentration of the impurity $6a$ thus implanted under the conditions is developed at a depth of about 0–300 Å from the surface of the semiconductor substrate 1.

As described above, after the first-layer gate electrodes 5 are formed on the semiconductor substrate 1, the impurity $6a$ is implanted in the principal surface of the semiconductor substrate 1 associated with the regions between the first-layer gate electrodes 5 (where the second-layer gate electrodes 9 are to be formed) so as to effect the first information write operation, thereby implanting the information write impurity $6a$ by use of the first-layer gate electrodes 5 as the mask. Consequently, the impurity for writing information $6a$ is implanted in a self-aligning fashion with respect to the first-layer gate electrodes 5. That is, since the information write operations for the memory cells $Q_2$ and $Q_4$ can be respectively achieved in a self-aligning fashion, the aligning margin can be minimized in the manufacturing process and hence the areas of the memory cells $Q_1$–$Q_8$ can be reduced.

Figure 6:
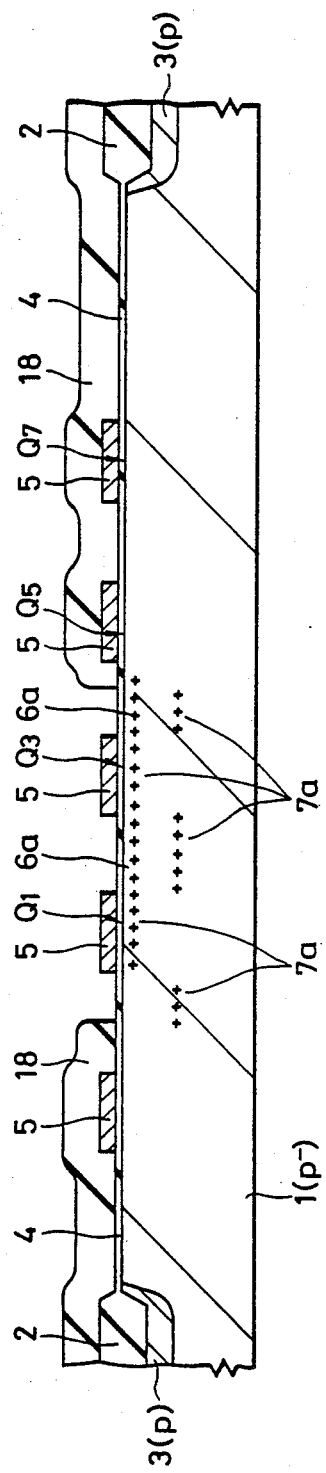

Subsequently, removing the mask 17, there is formed a mask 18 for implanting an impurity, the mask 18 having openings, as shown in FIG. 6, in the regions associated with the memory cells $Q_1$ and $Q_3$ (regions of the first-layer gate electrodes 5). The mask 18 is so configured, in consideration of the margin of the mask matching in the manufacturing process, that the opening end portions are located on the regions where the impurity substance $6a$ is implanted to form the second-layer gate electrodes 9. The mask 18 is formed, for example, of a photoresist film.

Next, on the surface of the semiconductor substrate 1 corresponding to the regions of the memory cells $Q_1$ and $Q_3$ (beneath the first-layer gate electrodes 5), an impurity $7a$ for writing second information is implanted through the first-layer gate electrodes 5 so as to effect the second information write operation. The implantation of the impurity $7a$ is conducted by using the mask 18 and the first-layer gate electrodes 5 not covered therewith as the mask. The impurity substance $7a$ is implanted in the threshold voltage control regions respectively of the memory cells $Q_1$ and $Q_3$ to change the depletion-type MISFETs having a low threshold voltage to enhancement-type MISFETs having high threshold voltage. As the impurity $7a$, boron (B) is implanted with an impurity concentration of about $1 \times 10^{13}$ to $3 \times 10^{13}$ atoms/cm². The impurity $7a$ is implanted by use of ion implantation technology with a high energy of, for example, about 300 KeV which allows the ions to pass through the first-layer gate electrodes 5. The mask 18 is formed with a thickness which does not allow the ions to pass therethrough. In the regions exposed in the openings of the mask 18 where the memory cells $Q_2$ and $Q_4$ are to be formed, since the ions do not pass through the first-layer gate electrodes 5 (the ions passing between the first-layer gate electrodes 5), the impurity $7a$ is implanted in a deep region other than the threshold voltage control regions in the semiconductor substrate 1. That is, in the regions where the memory cells $Q_2$ and $Q_4$ are to be formed, the impurity for writing information $7a$ is implanted in regions which do not influence the threshold voltage. The impurity concentration of the impurity $7a$ thus implanted develops a peak value at a depth of about 0–300 Å from the surface of the semiconductor substrate 1 in the region of the memory cells $Q_1$ and $Q_3$. Moreover, in the regions where the memory cells $Q_2$ and $Q_4$ are to be formed, the impurity concentration of the impurity $7a$ develops a peak value at a depth of 3000-10000 Å from the surface of the semiconductor substrate 1.

As described above, after the first-layer gate electrodes 5 are formed on the semiconductor substrate 1, the impurity for writing second information 7a is implanted, through the first-layer gate electrodes 5, in the principal surface of the semiconductor substrate 1 beneath the first-layer gate electrodes 5 so as to achieve the second information write operation. Accordingly, the information write operations (control of the threshold value) of the memory cells $Q_1$ and $Q_3$ comprising the first-layer gate electrodes 5 can be effected in self-alignment with respect to the first-layer gate electrodes 5. That is, a margin for the mask alignment can be dispensed with in the manufacturing processes of the first-layer gate electrodes 5 and the regions in which the impurity 7a is implanted. As a consequence, since the dimension of the gate length can be minimized for both the first-layer gate electrodes 5 and the second-layer gate electrodes 9, and the areas of the memory cells $Q_1-Q_8$ can be reduced, the degree of integration of the vertical-type mask ROM can be greatly improved.

In addition, since the dimension of the gate length can be minimized for the respective memory cells $Q_1-Q_8$ and the series resistance of the unit memory cell row can be hence lowered, the speed to control the precharge potential is increased in the information read operation and the operation speed of the vertical-type ROM can be increased.

Moreover, since the second information write operation is achieved by implanting the information write impurity 7a through the first-layer gate electrodes 5 thus formed, the number of steps in the manufacturing process can be reduced as compared with the case where the second information is written before the first-layer gate electrodes 5 are formed.

Figure 7:
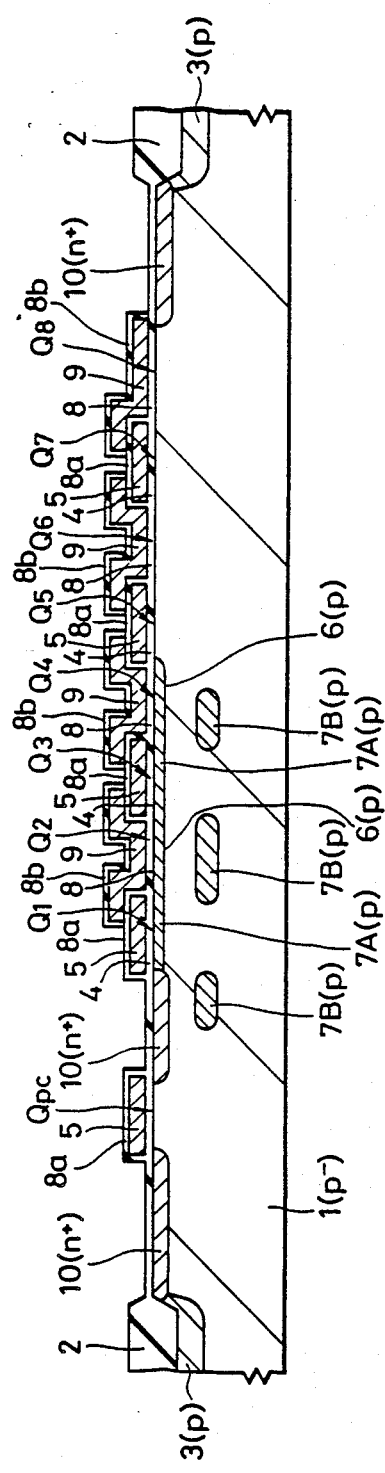

After the second information write operation is achieved as shown in FIG. 6, the gate insulation layer 4 which is disposed between the first-layer gate electrodes 5 and which is polluted due to the implantation of the information write impurity 7a is removed by an etching process. Thereafter, as shown in FIG. 7, the gate insulation layer 8 is formed in the regions where the memory cells $Q_2$, $Q_4$, $Q_6$ and $Q_8$ are to be formed. The gate insulation layer 8 is a silicon oxide film attained by thermally oxidizing the surface of the semiconductor substrate 1. As seen in FIG. 7, oxide layer 8a is formed on first-layer gate electrodes at the time of forming gate insulation layer 8.

Next, the second-layer gate electrodes 9 are formed on the gate insulation layer 8. The second-layer gate electrodes 9 are formed, for example, like the first-layer gate electrodes 5, by forming a polycrystalline silicon film, which is formed by use of the CVD method, and thereafter subjecting the polycrystalline silicon film to a patterning by an etching process. The second-layer gate electrodes 9 thus patterned through the etching process are so configured to have a dimension of separation therebetween on the first-layer gate electrodes 5. In the process to form the second-layer gate electrodes 9, the memory cells $Q_2$, $Q_4$, $Q_6$ and $Q_8$ are established.

Subsequently, a semiconductor region 10 of n+ type is formed on both sides of the gate electrodes 5 of the precharge MISFET Qpc and a side of the memory cell $Q_8$. The semiconductor region 10 can be formed by implanting an n type impurity material (e.g., As) by ion implantation using the gate electrodes 5 and 9 as the mask and by effecting thereafter an annealing process.

The information write impurity substances 6a and 7a above are formed into the respective p type regions 7A and 7B, for example, in the annealing process forming the semiconductor region 10.

Next, the insulation layer 11, the connecting hole 12, the wiring 13, the insulation layer 14, the connecting hole 15, and the data line 16 are sequentially formed to complete the vertical-type mask ROM shown in FIGS. 2-3.

According to the present invention, the sequence of the first information write operation and the second information write operation may be reversed. That is, according to the present invention, after the first-layer gate electrodes 5 are formed, the impurity 7a may be implanted through the first-layer gate electrodes 5 and then the impurity 6a may be implanted in the regions between the first-layer gate electrodes 5.

Moreover, according to the present invention, the memory cells $Q_1-Q_8$ may be beforehand established as enhancement-type MISFETs, by implanting an impurity to provide a predetermined memory cell Q to have a low threshold voltage value, thereby establishing a depletion-type MISFET. In this case, an n type impurity such as As or P is implanted in the predetermined region.

Embodiment II

According to the Embodiment II, in the information write operation to implant the information write impurity substance through the first-layer gate electrodes, the position of the impurities in the direction of the depth can be controlled for the impurity write substance implanted respectively to the regions below the first-layer gates and the second-layer gates.

Figure 8:
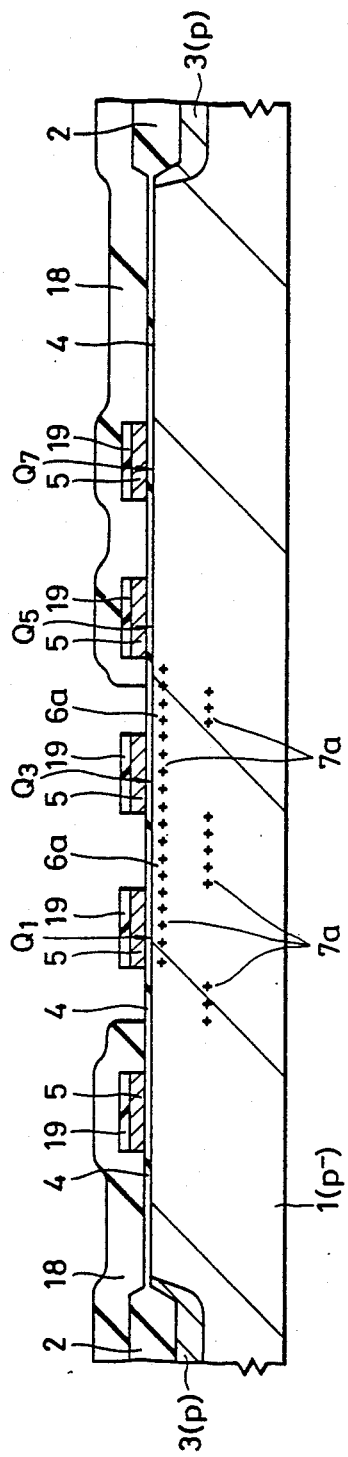
FIG. 8 is a cross-sectional view depicting a substantial part of the memory cell array in a predetermined manufacturing processing step of a vertical-type mask ROM as Embodiment II according to the present invention.

FIG. 8 shows a vertical-type mask ROM as the Embodiment II (crosssectional view of the substantial portion in the predetermined manufacturing process).

In the Embodiment II, before information is written in the regions beneath the first-layer gate electrodes 5, a mask 19 is disposed over the first-layer gate electrodes 5 and then ion implantation is performed to implant an impurity substance 7a in the substrate. The mask 19 is formed, for example, in the manufacturing process (etching process) of the first-layer gate electrodes 5 (both layers are etched at the same time). That is, on a polycrystalline silicon layer disposed to form the gate electrodes 5 over the entire surface of the substrate, a silicon oxide film or a silicon nitride film obtained through the CVD method is formed. Thereafter, an anisotropic etching, such as a reactive ion etching (RIE), is effected by use of a photoresist film (not shown) so as to sequentially etch the insulation layer and the polycrystalline silicon layer, thereby attaining the first-layer gate electrodes 5 and the mask 19. In addition, the mask 19 may be the etching mask used to manufacture the first-layer gate electrodes 5, namely, the photoresist layer. In this case, the masks 18-19 are not of the positive type, namely, either one or both thereof is or are of the negative type.

As described above, since the mask 19 is formed over the first-layer gate electrodes 5 in a self-alignment fashion with respect thereto, and the impurity substance 7a is implanted through the gate electrodes 5 and the mask 19, thereby writing information in the regions beneath the first-layer gate electrodes 5, it becomes possible to increase the implantation energy to implant the impurity substance 7a through the mask 19, and a sufficient difference can be guaranteed between the depth of the positions of the regions beneath the first-layer electrodes 5 and the second-layer gate electrodes 9 where the impurity substance is implanted (i.e., a great positional difference is secured). That is, when selecting energy to implant the impurity substance 7a in the surface of the semiconductor substrate corresponding to the memory cells $Q_1$ and $Q_3$, the impurity substance 7a is implanted at deep positions in regions beneath the region where the memory cells $Q_2$ and $Q_4$ are to be formed, so that the deeply implanted regions have less influence on the threshold voltages of the memory cells $Q_2$ and $Q_4$. This increases the reliability of the information write operation of the vertical-type mask ROM.

In the Embodiment II, the ion implantation process of the impurity substance 6a and the other processes are achieved in the same fashion as for the Embodiment I.

Embodiment III

According to Embodiment III of the present invention, the dimension of separation between the second-layer gate electrodes is minimized in the unit memory cell row and hence the degree of integration of the vertical-type mask ROM is further improved.

Figure 10:
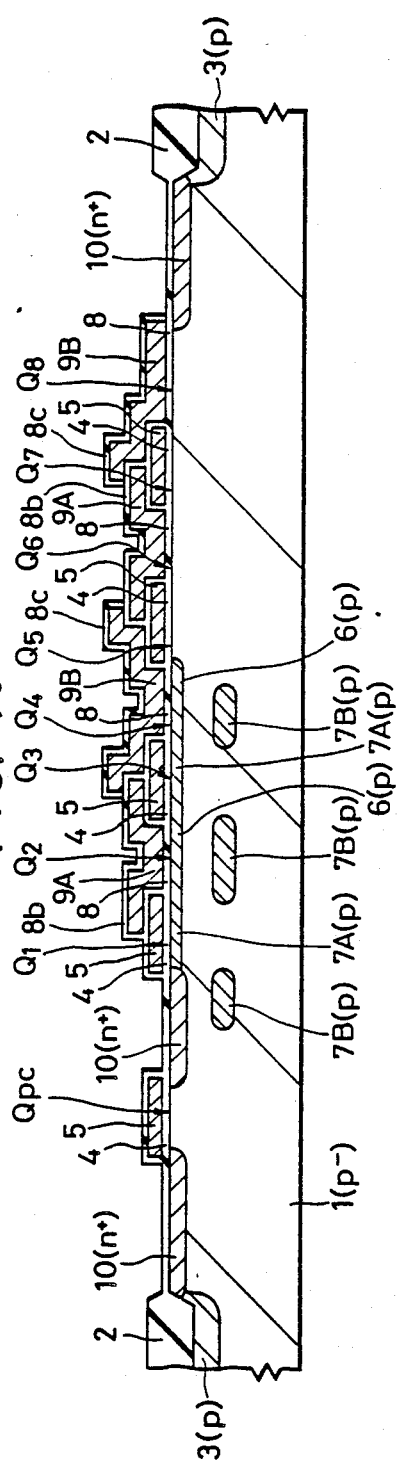
FIG. 10 is a cross-sectional view depicting a substantial part of the memory cell array in a predetermined manufacturing processing step of a vertical-type mask ROM in the Embodiment III according to the present invention.
Figure 9:
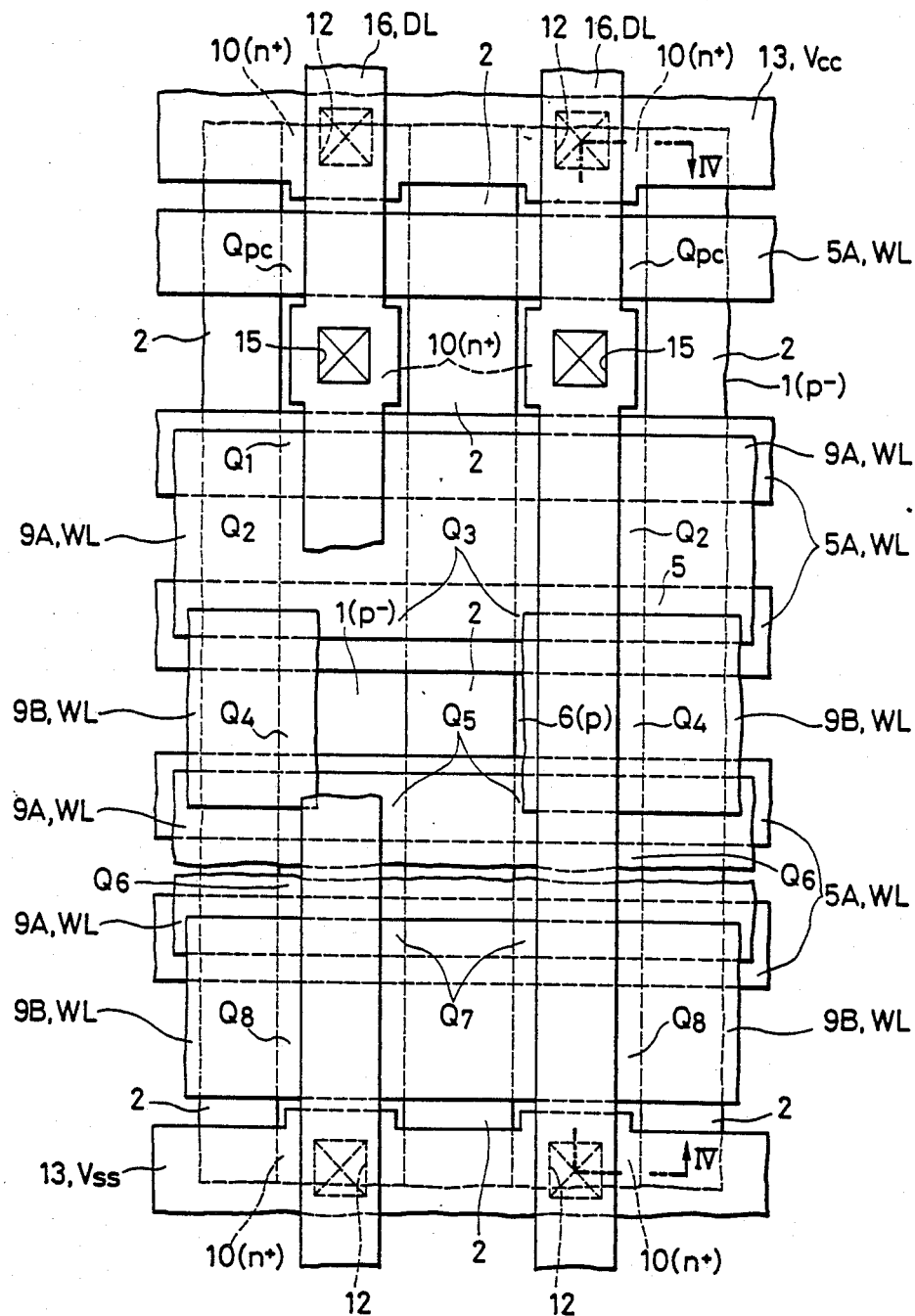
FIG. 9 is a plan view illustrating a primary part of the memory cell array of a vertical-type mask ROM as Embodiment II according to the present invention.
Figure 11:
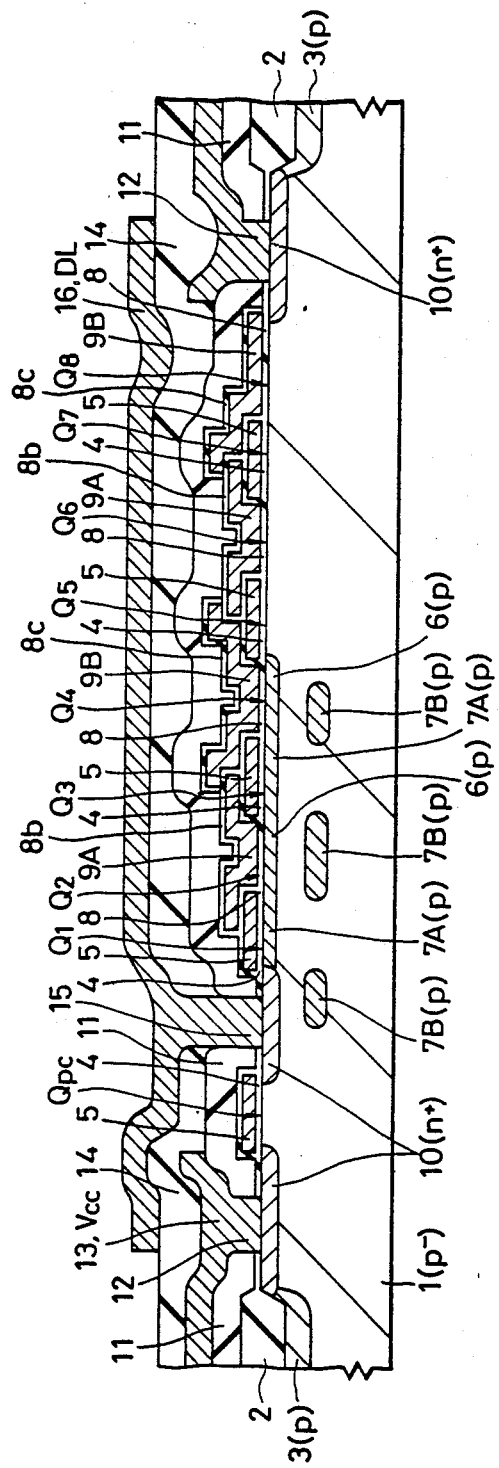
FIG. 11 is a cross-sectional view of the memory cell array of FIG. 9 along line IV–IV.

FIG. 9 shows a memory cell array of a vertical-type mask ROM of the Embodiment III according to the present invention, whereas FIGS. 10-11 are cross-sectional vies of a substantial portion of the memory array.

In the Embodiment III, in place of the second-layer gate electrodes 9 of the Embodiment II, second-layer gate electrodes 9A and third-layer gate electrodes 9B (formed from a third electrically conductive layer in the manufacturing process) are alternately disposed. The second-layer gate electrodes 9A are arranged at every second position between the first-layer gate electrodes 5. The third-layer gate electrodes 9B are disposed, after the second-layer gate electrodes 9A are formed, between the first-layer gate electrodes 5 disposed between the second-layer gate electrodes 9A. That is, the second-layer gate electrodes 9A and the third-layer gate electrodes 9B are alternately arranged between the first-layer gate electrodes 5 in the direction of the gate length. In other words, end portions of the second-layer gate electrodes 9A and end portions of the third-layer gate electrodes 9B are so configured to overlap with each other on the first-layer gate electrodes 5.

In the vertical-type mask ROM thus structured, the second-layer gate electrodes 9A can be overlapped with the third-layer gate electrodes 9B and hence the dimension of separation therebetween (between the electrodes 9A and 9B) on the first-layer gate electrodes 5 can be dispensed with. That is, the interval space (which has been ordinarily required as the minimum work space dimension) between the gate electrodes of the Embodiment I is not necessary. In the designing process, since the dimension of the gate length need not be increased for the first-layer gate electrodes 5 in consideration of the separation dimension, the dimension of the gate length can be reduced for the first-layer gate electrodes 5, and hence the areas of the memory cells $Q_1$, $Q_3$, $Q_5$ and $Q_7$ comprising the first-layer gate electrodes 5 can be minimized. Namely, the degree of integration of the vertical-type mask ROM can be improved.

While the present invention has been described with reference to particular illustrative embodiments, it is not restricted by those embodiments but only by the appended claims. It is to be appreciated that those skilled in the art can change and modify the embodiments without departing from the scope and spirit of the invention.

Figure 12:
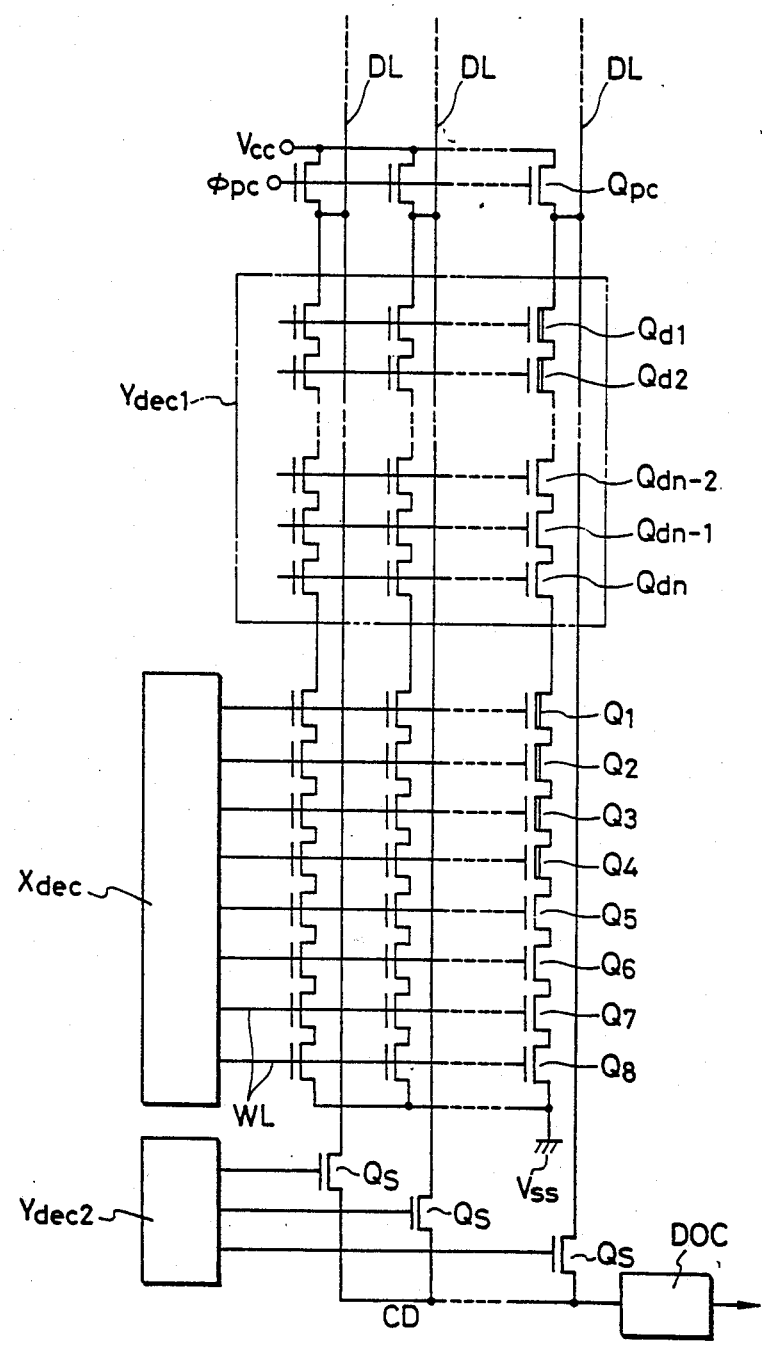
FIG. 12 is a schematic circuit diagram showing another application example of the present invention.

For example, the vertical-type mask ROM according to the present invention may also be applied to a logic circuit such as a programmable logic array (PLA). As shown in FIG. 10, for example, by use of the same configuration as that of the vertical-type mask ROM of the present invention, a part of the Y decoder circuit, namely, Ydecl can be implemented. In FIG. 12, Ydecl is connected between the unit memory cell row and the precharge MISFET Qpc so as to selectively connect the unit memory cell row to the data line DL. The unit select circuit of the Y decoder Ydecl includes MISFET $Qd_1$–$Qdn$, which are of the depletion or enhancement type according to the present invention. A unit select circuit corresponds to a memory cell row. The Y decoder Ydecl is supplied with a predetermined portion of the complementary address signals generated by an address buffer circuit (not shown), namely, the signals are fed to respective gate electrodes of the MISFET $Qd_1$–$Qdn$. The vertical-type mask ROM shown in FIG. 10 includes a repetition of configuration of the MISFET Qpc, the Y decoder Ydecl, and the memory cell array symmetrically arranged with the center set to the power source voltage line. Among a plurality of unit memory cells corresponding to the same data line, a unit memory cell row selected by the Y decoder Ydecl is connected to the data line. In this case, the Y decoder Ydecl can be regarded not as a memory circuit but as a logic circuit for selecting a memory cell row depending on a signal supplied from an external device.

Particularly, in the vertical-type mask ROM, as shown in FIG. 12, since a portion of the Y decoder and the memory cell array are configured in the same structure the degree of integration can be further increased.

Furthermore, the Embodiments I-III may be combined in a system.

The MISFET Qpc or the like constituting a peripheral circuit of the memory cell may be of any one of various structures, such as the known lightly doped drain (LDD) structure and the known double diffused drain (DDD) structure.

The memory cell array may be formed in a well region of p⁻type disposed in an n type semiconductor substrate.

The present invention is also effectively applicable to a semiconductor integrated circuit device such as a 1-chip microcomputer formed in a semiconductor substrate together with other logic circuits.

The gate electrodes (word lines) may be formed by the repetition of conductive layers including at least four layers.

Of the invention disclosed by the present specification, the representative features will be briefly described.

After the first-layer gate electrodes of the vertical-type mask ROM are formed, the information write impurity substance is implanted, through the first-layer gate electrodes, in the principal surface of the semiconductor substrate beneath the first-layer gate electrodes to write information therein, which enables the information write operation of the memory cells comprising the first-layer gate electrodes to be effected in a self-aligning fashion with respect to the first-layer gate electrodes; consequently, the areas of the memory cells can be reduced and hence the degree of integration of the vertical-type mask ROM is improved.

Moreover, since the second-layer gate electrodes and the third-layer gate electrodes are alternately formed between the first-layer gate electrodes, the second-layer gate electrodes and the third-layer gate electrodes can be overlapped with each other to minimize (or eliminate) the dimension of separation therebetween on the first-layer gate electrodes; consequently, the dimension of the gate length can be minimized for the first-layer gate electrodes and hence the areas of the memory cells comprising the first-layer gate electrodes can be reduced, which improves the degree of integration of the vertical-type mask ROM.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A manufacturing method of a semiconductor memory device having a vertical-type mask ROM with first-layer and second-layer gate electrodes, in which the second-layer gate electrodes are formed from a second conductive layer, between adjacent ones of the first-layer gate electrodes, which first-layer gate electrodes are formed from a first conductive layer and are disposed at a predetermined interval in a direction of gate length of the first-layer gate electrodes, comprising the steps of:

introducing an impurity of first conductivity type into a principal surface of a semiconductor substrate;

forming the first-layer gate electrodes at the predetermined interval on the principal surface of the semiconductor substrate;

forming a first masking layer having openings at positions corresponding to said predetermined interval between said ones of first-layer gate electrodes, ends of said masking layer being disposed on said first-layer gate electrodes;

implanting an impurity of a second conductivity type to write information into the principal surface of the semiconductor substrate between the first-layer gate electrodes by using the first-layer gate electrodes as a mask so as to write first information, said first-layer gate electrodes used as said mask being disposed in said openings of said first masking layer;

removing said first masking layer;

forming a second masking layer having openings at positions corresponding to particular ones of said first-layer gate electrodes, ends of said second masking layer being disposed between said ones of said first-layer gate electrodes;

further implanting an impurity of the second conductivity type to write information into the principal surface of the substrate beneath said first-layer gate electrodes, through the first-layer gate electrodes disposed in said openings of said second masking layer, thereby writing second information; and forming the second layer gate electrodes on the principal surface of the substrate in which said first information has been written.

2. A method according to claim 1, wherein said implanting an impurity of a second conductivity type is performed at an energy level to implant impurities sufficiently near the principal surface of the substrate so as to form an impurity region extending to the principal surface of the substrate between the first-layer gate electrodes; and wherein said further implanting an impurity of a second conductivity type is performed at an energy level to implant impurities sufficiently spaced from the principal surface of the substrate between the first-layer gate electrodes so as to form an impurity region spaced from the principal surface between the first-layer gate electrodes, and to implant impurities sufficiently near the principal surface of the substrate beneath the first-layer gate electrodes so as to form an impurity region extending to the principal surface of the substrate beneath the first-layer gate electrodes.

3. A method according to claim 1, further comprising a step of annealing, after said implanting an impurity of a second conductivity type and said further implanting an impurity of a second conductivity type, so as to form respective impurity regions in the semiconductor substrate, extending to the principal surface of the substrate, between the first-layer gate electrodes and beneath the first-layer gate electrodes.

4. A method according to claim 1, wherein the first-layer gate electrodes and the second-layer gate electrodes respectively form memory cells including an MISFET.

5. A method according to claim 1, wherein said implanting an impurity of the second conductivity type to write information implants the impurity substance by ion implantation, with a sufficiently low energy which does not allow implanted ions to pass through the first-layer gate electrodes; and wherein said further implanting an impurity of the second conductivity type for writing information implants the impurity by ion implantation, with a sufficiently high energy which allows implanted ions to pass through the first-layer gate electrodes.

6. A method according to claim 5, wherein said further implanting an impurity of the second conductivity type for writing implants the impurity in threshold voltage control regions beneath the first-layer gate electrodes and in regions other than threshold voltage control regions beneath the second-layer gate electrodes.

7. A method according to claim 1, wherein said first and second masking layers are made of photoresist films.

8. A method according to claim 1, wherein said first conductivity type is n, and said second conductivity type is p.

9. A method according to claim 1, wherein said impurity of the first conductivity type is As or P.

10. A method according to claim 2, wherein said implanting an impurity of the second conductivity type is performed at an energy of about 60 keV to implant boron fluoride near the principal surface of the substrate, and wherein said further implanting an impurity of the second conductivity type is performed at an energy of about 300 keV to implant boron to pass through the first-layer gate electrodes.

11. A method according to claim 1, wherein said first-layer gate electrodes and second-layer gate electrodes are made of polycrystalline silicon.

12. A method according to claim 1, wherein said first-layer gate electrodes and second-layer gate electrodes are made of a composite in which a refractory metal film or a refractory metal silicide film is laminated on a polycrystalline silicon layer.

13. A method according to claim 1, wherein said implanting an impurity of a second conductivity type to write the first information and said further implanting an impurity of a second conductivity type to write the second information are implanting steps for respectively setting threshold voltages below said second-layer gate electrodes and below said first-layer gate electrodes from a depletion type to an enhancement type, or vice versa.

* * * * *